US008757823B2

(12) United States Patent
Buis et al.

(10) Patent No.: US 8,757,823 B2
(45) Date of Patent: Jun. 24, 2014

(54) MOUNTINGS FOR ROTATION OF ARRAY OF REFLECTIVE ELEMENTS AND LITHOGRAPHIC APPARATUS INCORPORATING SAME

(75) Inventors: Edwin Johan Buis, Belfeld (NL); Gosse Charles De Vries, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 178 days.

(21) Appl. No.: 13/381,317

(22) PCT Filed: Jun. 8, 2010

(86) PCT No.: PCT/EP2010/058021
§ 371 (c)(1),
(2), (4) Date: Dec. 28, 2011

(87) PCT Pub. No.: WO2011/000671
PCT Pub. Date: Jan. 6, 2011

(65) Prior Publication Data
US 2012/0105989 A1 May 3, 2012

Related U.S. Application Data

(60) Provisional application No. 61/213,659, filed on Jun. 30, 2009.

(51) Int. Cl.
G02B 7/182 (2006.01)

(52) U.S. Cl.
USPC ............................ 359/849; 359/871; 248/573

(58) Field of Classification Search
None
See application file for complete search history.

(56) References Cited

U.S. PATENT DOCUMENTS

| 3,815,429 | A | * | 6/1974 | Goulart ........................ 74/89.45 |
| 4,721,274 | A | * | 1/1988 | Erb ............................ 248/179.1 |
| 5,270,737 | A | | 12/1993 | Nakasugi et al. |
| 6,059,250 | A | | 5/2000 | Reuter et al. |
| 6,402,329 | B1 | | 6/2002 | Bailly et al. |
| 2005/0030653 | A1 | | 2/2005 | Holderer et al. |
| 2005/0030656 | A1 | * | 2/2005 | Holderer et al. .............. 359/879 |
| 2005/0274897 | A1 | * | 12/2005 | Singer et al. ................... 250/372 |
| 2013/0128252 | A1 | * | 5/2013 | Rassel et al. ..................... 355/67 |

OTHER PUBLICATIONS

International Search Report for PCT International Patent Application No. PCT/EP2010/058021, mailed Aug. 19, 2010.

* cited by examiner

*Primary Examiner* — Arnel C Lavarias
(74) *Attorney, Agent, or Firm* — Pillsbury Winthrop Shaw Pittman LLP

(57) ABSTRACT

An array of reflective elements in which at least one of the reflective elements is mounted on a mounting which comprises a rod at least partially located within a sleeve. A first end of the rod is fixed to a first end of the sleeve and a second end of the rod is moveable, the sleeve including a first resiliently flexible portion which is configured to bend in order to allow the movement of the second end of the rod to take place, wherein the reflective element is mounted at the first end of the sleeve such that bending of the sleeve causes rotation of the reflective element.

15 Claims, 13 Drawing Sheets

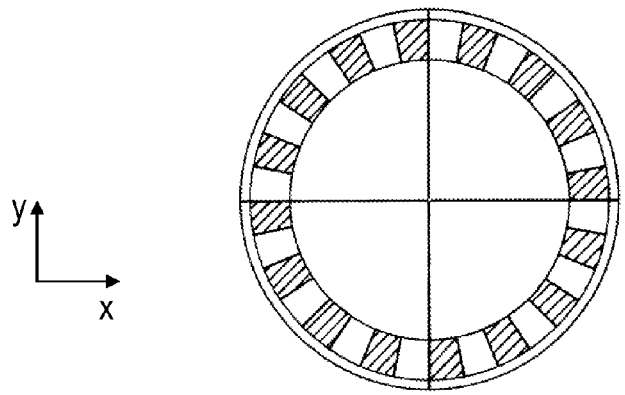
*Fig. 8a*
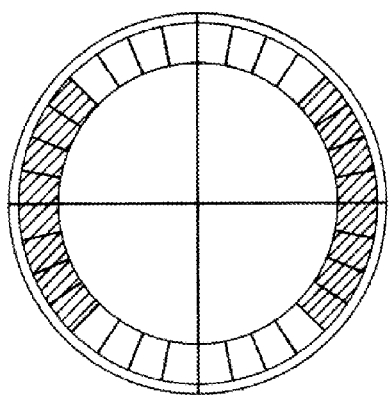 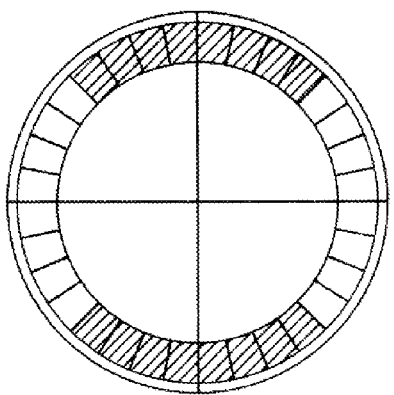
*Fig. 8b*        *Fig. 8c*
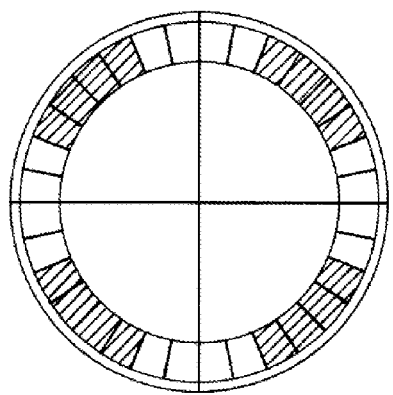 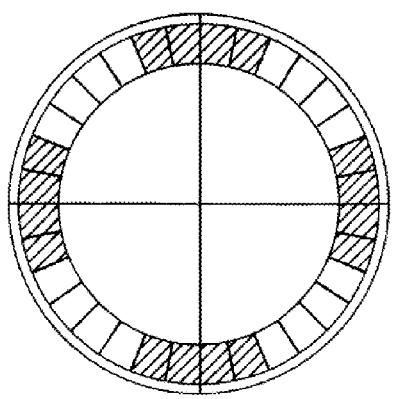
*Fig. 8d*        *Fig. 8e*

MOUNTINGS FOR ROTATION OF ARRAY OF REFLECTIVE ELEMENTS AND LITHOGRAPHIC APPARATUS INCORPORATING SAME

CROSS-REFERENCE TO RELATED APPLICATIONS

This application is the United States National Phase entry of PCT/EP2010/058021, filed Jun. 8, 2010, which claims the benefit of U.S. provisional application No. 61/213,659 which was filed on Jun. 30, 2009, both of which are incorporated herein in their entireties by reference.

FIELD

The present invention relates to a lithographic apparatus and to an array of reflective elements.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC. This pattern can be transferred onto a target portion (e.g. comprising part of a die, one die, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

A lithographic apparatus generally includes an illumination system. The illumination system receives radiation from a source, for example a laser, and provides a radiation beam (sometimes referred to as a "projection" beam) which is incident upon a patterning device. The radiation beam is patterned by the patterning device, and is then projected by a projection system onto a substrate.

It is known in the art of lithography that an image of the patterning device projected onto a substrate can be improved by providing the radiation beam with an appropriate illumination mode. Accordingly, an illumination system of a lithographic apparatus typically includes an intensity distribution adjustment apparatus arranged to direct, shape and control the intensity distribution of the radiation beam in a pupil plane of the illumination system, such that it has an illumination mode.

SUMMARY

Various intensity distribution adjustment apparatuses can control the illumination beam so as to achieve a desired illumination mode. For example, a zoom-axicon device (a combination of a zoom lens and an axicon) can be used to create an annular illumination mode, wherein the inner radial extent and outer radial extent ($\sigma_{inner}$ and $\sigma_{outer}$) of the illumination mode is controllable. A zoom-axicon device generally comprises multiple refractive optical components that are independently movable. A zoom-axicon device is therefore not suitable, for example, for use with extreme ultraviolet (EUV) radiation (e.g. radiation at about 13.5 nm), because radiation at this wavelength is strongly absorbed as it passes through refractive materials.

A spatial filter may be used to create an illumination mode. For example, a spatial filter with openings corresponding to a dipole illumination mode may be provided in a pupil plane of the illumination system in order to generate a dipole illumination mode. The spatial filter may be removed and replaced by a different spatial filter when a different illumination mode is desired. However, a spatial filter blocks a considerable proportion of the radiation beam, thereby reducing the intensity of the radiation beam when it is incident upon the patterning device. Known EUV sources struggle to provide EUV radiation at an intensity which is sufficient to allow a lithographic apparatus to operate efficiently. Therefore, it is not desirable to block a considerable portion of the radiation beam when forming the illumination mode.

It is desirable, for example, to provide an array of reflective elements which may be used to overcome or mitigate one or more shortcomings described herein or elsewhere.

In an aspect, there is provided an array of reflective elements, at least one of the reflective elements being mounted on a mounting which comprises a rod at least partially located within a sleeve, wherein a first end of the rod is fixed to a first end of the sleeve and a second end of the rod is moveable, the sleeve including a first resiliently flexible portion which is configured to bend in order to allow the movement of the second end of the rod to take place, wherein the reflective element is mounted at the first end of the sleeve such that bending of the sleeve causes rotation of the reflective element.

The array of reflective elements may form part of a lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 8a-e depict five illumination modes obtainable using an embodiment of the invention;

DETAILED DESCRIPTION

Figure 1:
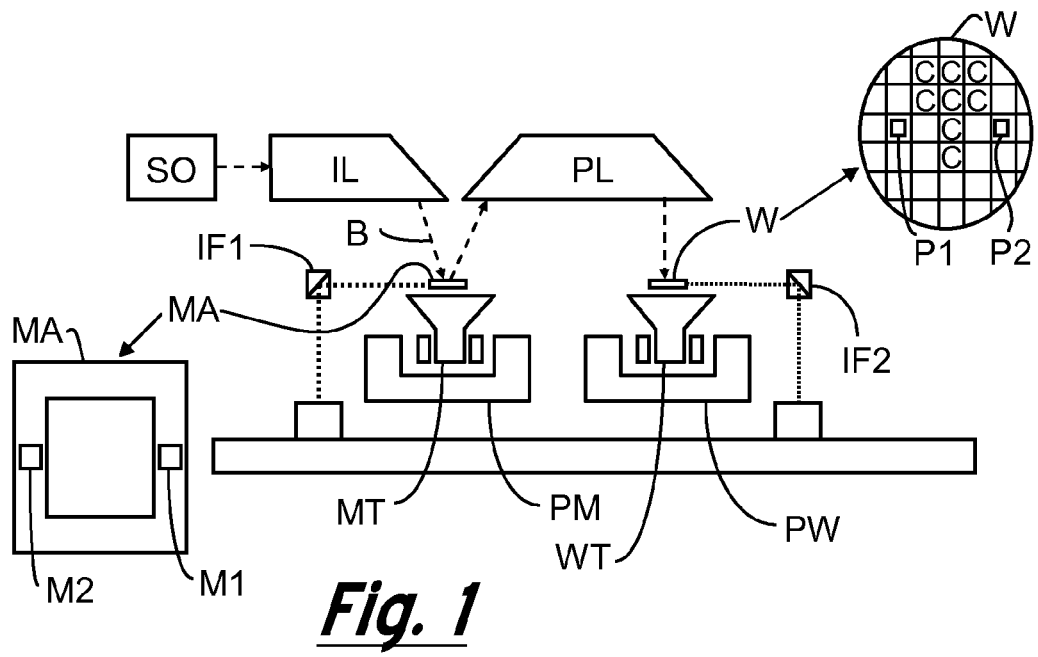
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Typically, in an EUV lithographic apparatus, the patterning device is reflective. Examples of patterning device include masks (transmissive), programmable mirror arrays (reflective), and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The patterning device support structure can use mechanical clamping, vacuum, or other clamping techniques, for example electrostatic clamping under vacuum conditions. The patterning device support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Usually, in an EUV radiation lithographic apparatus the optical elements of the projection system will be reflective. Any use of the term "projection lens" herein may be considered as synonymous with the more general term "projection system".

The illumination system described herein may include reflective components and optionally various other types of optical components for directing, shaping and controlling the beam of radiation.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in U.S. patent application publication no. US 2007-0013890.

The lithographic apparatus may be of a type wherein the substrate is immersed in a liquid having a relatively high refractive index, e.g. water, so as to fill a space between the final element of the projection system and the substrate. An immersion liquid may be applied to other spaces in the lithographic apparatus, for example, between the patterning device and the first element of the projection system Immersion techniques are well known in the art for increasing the numerical aperture of projection systems.

FIG. 1 schematically depicts a lithographic apparatus according to an embodiment of the invention. The apparatus comprises:

an illumination system IL arranged to condition a radiation beam B of radiation (e.g. DUV radiation or EUV radiation);

a support structure (e.g. a mask table) MT configured to support a patterning device (e.g. a mask) MA and connected to a first positioning device PM to accurately position the patterning device with respect to item PL;

a substrate table (e.g. a wafer table) WT configured to hold a substrate (e.g. a resist-coated wafer) W and connected to a second positioning device PW to accurately position the substrate with respect to item PL; and a projection system (e.g. a reflective projection lens) PL configured to image a pattern imparted to the radiation beam B by patterning device MA onto a target portion C (e.g. comprising one or more dies) of the substrate W.

As depicted in FIG. 1, the lithographic apparatus is a reflective type apparatus (e.g. employing a reflective mask or programmable mirror array of a type referred to above). Alternatively, the apparatus may be a transmissive type apparatus (e.g. employing a transmissive mask).

The illumination system IL receives a beam of radiation B from a radiation source SO. The source and the lithographic apparatus may be separate entities, for example when the source is an excimer laser. In such cases, the source is not considered to form part of the lithographic apparatus, and the radiation beam is passed from the source SO to the illumination system IL with the aid of a beam delivery system comprising for example suitable directing mirrors and/or a beam expander. In other cases the source may be integral part of the apparatus, for example when the source is a mercury lamp. The source SO and the illumination system IL, together with the beam delivery system if required, may be referred to as a radiation system.

The illumination system IL conditions the beam of radiation so as to provide a beam of radiation with a desired uniformity and a desired illumination mode. The illumination system IL comprises an intensity distribution adjustment apparatus configured to adjust the spatial intensity distribution of the radiation beam in a pupil plane (for example in order to select a desired illumination mode). The illumination system may comprise various other components, such as an integrator and coupling optics.

Upon leaving the illumination system IL, the radiation beam B is incident on the patterning device (e.g. mask) MA, which is held on the support structure MT. Having traversed the patterning device MA, the radiation beam B passes through the projection system PL, which focuses the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 can be used to accurately position the patterning device MA with respect to the path of the radiation beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignments marks). Similarly, in situations in which more than one die is provided on the patterning device MA, the patterning device alignment marks may be located between the dies.

The depicted apparatus in both FIGS. 1 and 2 can be used in the following preferred modes:

1. In step mode, the support structure MT and the substrate table WT are kept essentially stationary, while an entire pattern imparted to the radiation beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations of the above described modes of use, or entirely different modes of use, may also be employed.

As mentioned above, the illumination system IL comprises an intensity distribution adjustment apparatus. The intensity distribution adjustment apparatus is arranged to adjust the spatial intensity distribution of the radiation beam at a pupil plane in the illumination system, in order to control the angular intensity distribution of the radiation beam incident on the patterning device. The intensity distribution adjustment apparatus may be used to select different illumination modes at the pupil plane of the illumination system. Selection of an illumination mode may for example depend upon a property of a pattern which is to be projected from the patterning device MA onto the substrate W.

The spatial intensity distribution of the radiation beam at the illumination system pupil plane is converted to an angular intensity distribution before the radiation beam is incident upon the patterning device (e.g. mask) MA. In other words, there is a Fourier relationship between the pupil plane of the illumination system and the patterning device MA (the patterning device is in a field plane). The pupil plane of the illumination system is a Fourier transform plane of the object plane where the patterning device MA is located, and it is conjugate to a pupil plane of the projection system.

Figure 2:
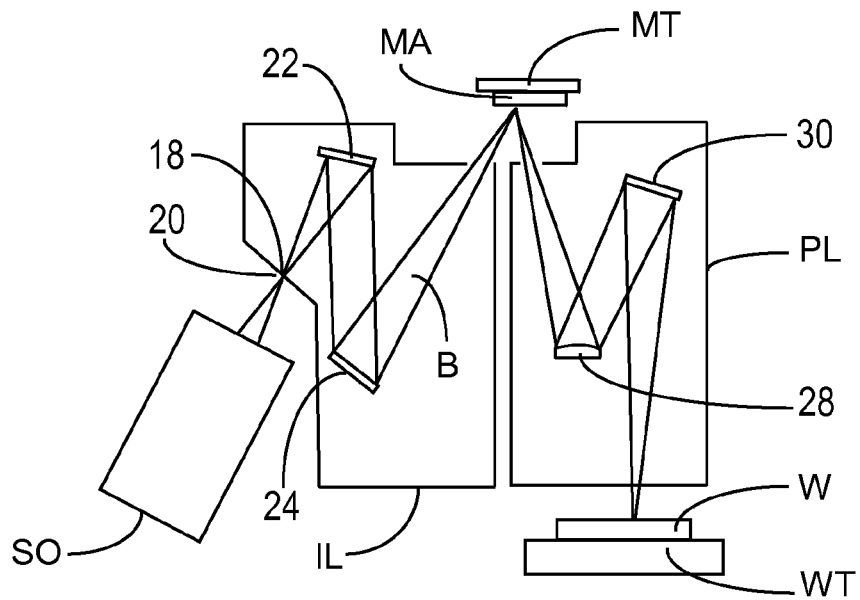
FIG. 2 schematically depicts part of the lithographic apparatus of FIG. 1 in more detail.

FIG. 2 schematically shows parts of the lithographic apparatus of FIG. 1 in more detail. The source SO generates a radiation beam B which is focused to a virtual source point collection focus 18 at an entrance aperture 20 in the illumination system IL. The radiation beam B is reflected in the illumination system IL via first and second reflective components 22, 24 onto the patterning device MA held on the support structure MT. The radiation beam B is then imaged in projection system PL via first and second reflective components 28, 30 onto a substrate W held on a substrate table WT.

It will be appreciated that more or fewer elements than shown in FIG. 2 may generally be present in the source SO, illumination system IL and projection system PL. For instance, in some embodiments the lithographic apparatus may also comprise one or more transmissive or reflective spectral purity filters. More or less reflective component parts may be present in the lithographic apparatus.

Figure 3:
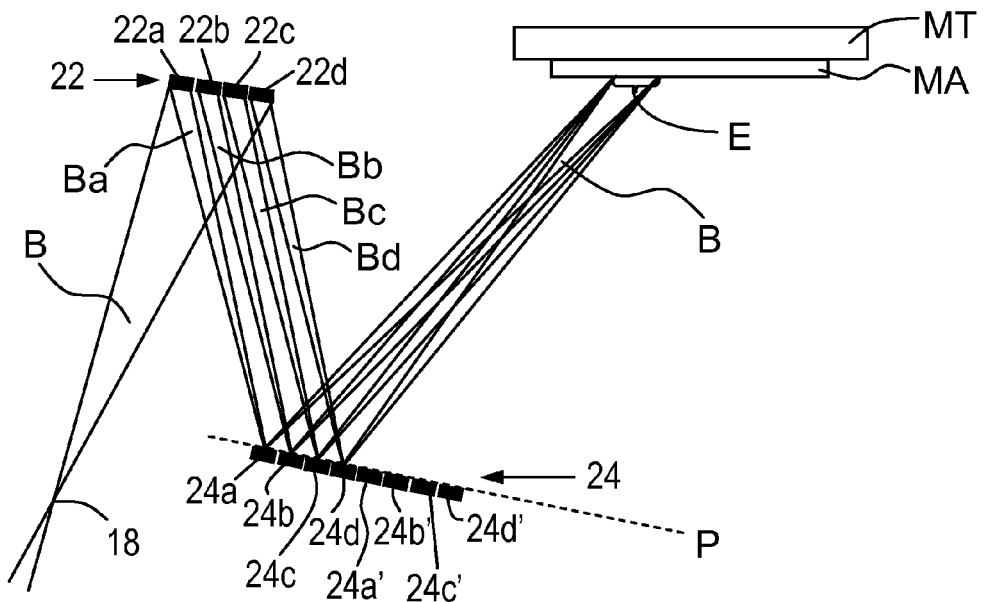
FIG. 3 illustrates operation of moveable reflective elements of an illumination system of the lithographic apparatus.

FIG. 3 schematically shows part of the lithographic apparatus, including the first and second reflective components 22, 24 of the illumination system in more detail. The first reflective component 22 comprises a plurality of primary reflective elements 22a-d (commonly known as field facet mirrors). The second reflective component 24 comprises a plurality of secondary reflective elements 24a-d, a'-d' (commonly known as pupil facet mirrors). The primary reflective elements 22a-d are configured to direct (reflect) radiation towards the secondary reflective elements 24a-d, a'-d'. Although only four primary reflective elements 22a-d are shown, any number of primary reflective elements may be provided. The primary reflective elements may be arranged in a two-dimensional array (or some other two-dimensional arrangement). Although only eight secondary reflective elements 24a-d,a'-d' are shown, any number of secondary reflective elements may be provided. The secondary reflective elements may be arranged in a two-dimensional array (or some other two-dimensional arrangement).

The primary reflective elements 22a-d have adjustable orientations, and may be used to direct radiation towards selected secondary reflective elements 24a-d,a'-d'.

The second reflective component 24 coincides with a pupil plane P of the illumination system IL. The second reflective component 24 therefore acts as a virtual radiation source which directs radiation onto the patterning device MA. A condenser mirror (not shown) may be provided between the second reflective component 24 and the patterning device MA. The condenser mirror may be a system of mirrors. The condenser mirror may be arranged to image the primary reflective elements 22a-d onto the patterning device MA.

The spatial intensity distribution of the radiation beam B at the second reflective component 24 defines the illumination mode of the radiation beam. Since the primary reflective elements 22a-d have adjustable orientations, they may be used to form different spatial intensity distributions at the pupil plane P, thereby providing different illumination modes.

In use, the radiation beam B is incident upon the primary reflective elements 22a-d of the first reflective component 22. Each primary reflective element 22a-d reflects a sub-beam of radiation towards a different secondary reflective element 24a-d,a'-d' of the second reflective component 24. A first sub-beam Ba is directed by a first primary reflective element 22a to a first secondary reflective element 24a. Second, third and fourth sub-beams Bb-d are directed by second, third and fourth primary reflective elements 22b-d respectively to second, third and fourth secondary reflective elements 24b-d.

The sub-beams Ba-d are reflected by the secondary reflective elements 24a-d towards the patterning device MA. The sub-beams may together be considered to form a single radiation beam B which illuminates an exposure area E of the patterning device MA. The shape of the exposure area E is determined by the shape of the primary reflective elements 22a-d. The exposure area E may be, for example, a rectangle, a curved band, or some other shape.

Each primary reflective element 22a-d forms an image of the virtual source point collection focus 18 at a different secondary reflective element 24a-d,a'-d' of the second reflective component 24. In practice, the focus 18 will not be a point, but will instead be a virtual source with a finite cross-sectional dimension (e.g., a diameter of, for example, 4-6 mm). Consequently, each primary reflective element 22a-d will form an image of the virtual source which has a finite cross-sectional dimension (e.g. a diameter of, for example, 3-5 mm) at the secondary reflective elements 24a-d,a'-d'. The secondary reflective elements 24a-d,a'-d' may have cross-sectional dimensions (e.g., diameters) which are larger than the image cross-sectional dimensions (to avoid radiation falling between secondary reflective elements and thereby being lost). The focus 18 and images of the focus are shown as points in the Figures for ease of illustration.

The primary and secondary reflective elements have optical powers. Each primary reflective element 22a-d has a negative optical power, and forms an image of the virtual source 18 which is smaller than the virtual source. Each secondary reflective element 24a-d,a'-d' has a positive optical power, and forms an image of the primary reflective element 22a-d which is larger than the primary reflective element. As mentioned above, the image of the primary reflective element 22a-d is the exposure area E.

The orientation of the primary reflective elements 22a-d determines the illumination mode which is formed at the pupil plane P. For example, the primary reflective elements 22a-d may be oriented such that radiation sub-beams are directed at the four innermost secondary reflective elements 24c,d,a',b'. This would provide an illumination mode which could be considered to be a one-dimensional equivalent of a standard (disk-shaped) illumination mode. In an alternative example, the primary reflective elements 22a-d may be oriented such that radiation sub-beams are directed at two secondary reflective elements 24a-b at a left hand end of the second reflective component 24, and at two secondary reflective components 24c'-d' at a right hand end of the second reflective component. This would provide an illumination mode which could be considered to be a one-dimensional equivalent of an annular illumination mode.

Each of the primary reflective elements 22a-d is configured such that it may be in one of two particular orientations—a first orientation and a second orientation. The first orientation is such that the primary reflective element reflects a sub-beam of radiation towards a first desired location on the second reflective component 24. The second orientation is such that the primary reflective element reflects the sub-beam of radiation towards a second desired location on the second reflective component 24. In an embodiment, the primary reflective element is not arranged to move to a third orientation, but instead is only moveable between the first orientation and the second orientation.

Figure 4:
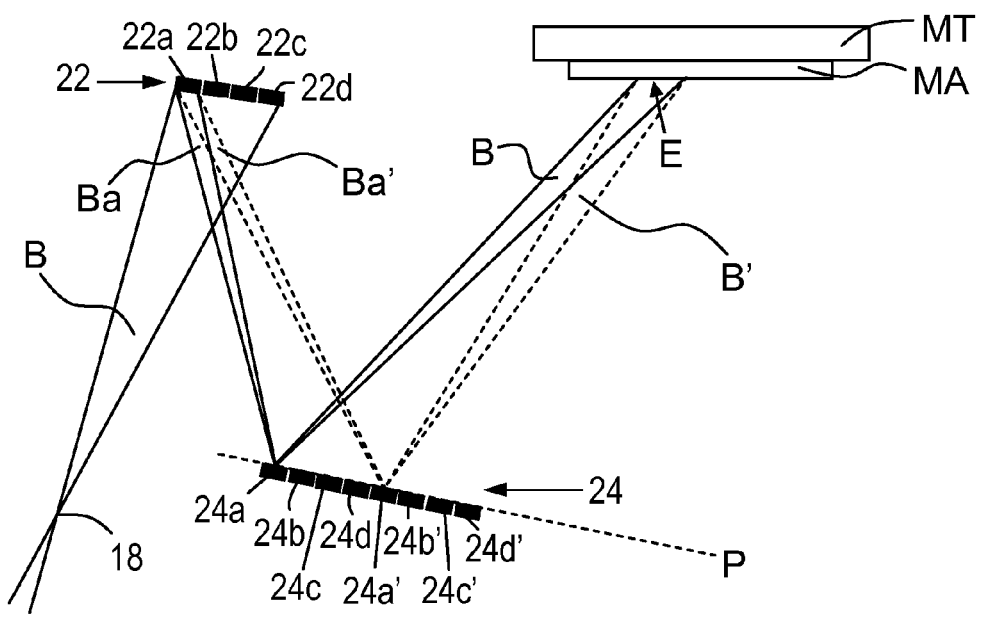
FIG. 4 illustrates an effect of movement of a primary reflective element of first reflective component of the illumination system of the lithographic apparatus.

FIG. 4 illustrates the movement of a primary reflective element between first and second orientations, using as an example the first primary reflective element 22a of the first reflective component 22. When the first primary reflective element 22a is in a first orientation, it directs a radiation sub-beam Ba towards a first secondary reflective element 24a of the second reflective component 24. When the first primary reflective element 22a is in a second orientation, it directs a radiation sub-beam Ba' (shown with dotted lines) towards a second secondary reflective element 24a' of the second reflective component 24. In an embodiment, the first primary reflective element 22a is not arranged to move to any other orientation, and therefore is not arranged to direct the radiation sub-beam towards any other secondary reflective element 24b-d,b'-d'.

The above description refers to each primary reflective element 22a-d directing radiation sub-beams towards a secondary reflective element 24a-d,a'-d'. In any of the embodiments the secondary reflective element irradiated by a given sub-beam may be a member of a group of secondary elements all disposed within a single location on the pupil plane or on the second reflective component, the location being associated with an illumination mode. For this reason, the term 'location' may be used instead of secondary reflective element (the term 'location' being intended to encompass a single secondary reflective element or a plurality of secondary reflective elements).

Each primary reflective element 22a-d is arranged to direct a radiation sub-beam to two different locations. The first location and the second location associated with each primary reflective element 24a-d are different and unique, with respect to the locations which receive radiation sub-beams from other primary reflective elements. By configuring each primary reflective element 22a-d appropriately, radiation may be directed towards the requisite locations in the pupil plane P of the second reflective component 24 so as to produce a spatial intensity distribution which corresponds with a desired illumination mode.

Although FIGS. 3 and 4 show only four primary reflective elements 22a-d, the first reflective component 22 may comprise many more primary reflective elements. The first reflective component 22 may comprise for example up to 100, up to 200, or up to 400 primary reflective elements. The first reflective component 22 may comprise, for example, any number in the range of 100-800 primary reflective elements. The reflective elements may be mirrors. The first reflective component 22 may comprise an array of 1024 (e.g. 32×32) mirrors, or 4096 (e.g. 64×64) mirrors, or any suitable number of mirrors. The primary reflective elements may be arranged in a two-dimensional grid-like formation. The primary reflective elements may be arranged in a plane which crosses through the radiation beam.

The first reflective component 22 may comprise one or more arrays of primary reflective elements. For example, the primary reflective elements may be arranged or grouped to form a plurality of arrays, each array for example having 32×32 mirrors. In the text, the term "array" may mean a single array or a group of arrays.

The secondary reflective elements 24a-d,a'-d' may be mounted such that the orientations of the secondary reflective elements are fixed.

Figure 5A:
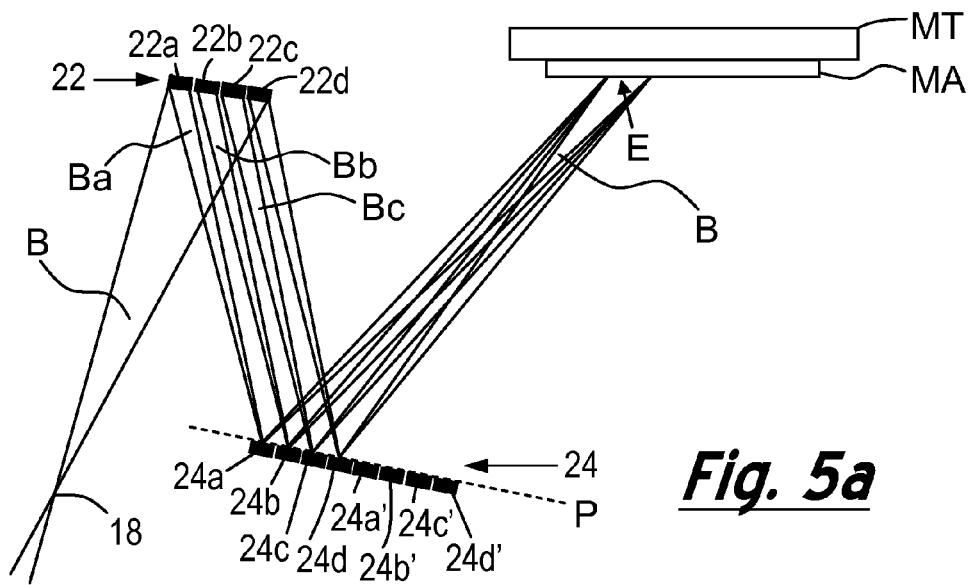
FIGS. 5a and 5b illustrate operation of moveable reflective elements of an illumination system of the lithographic apparatus, and a resulting y-dipole illumination mode.
Figure 5B:
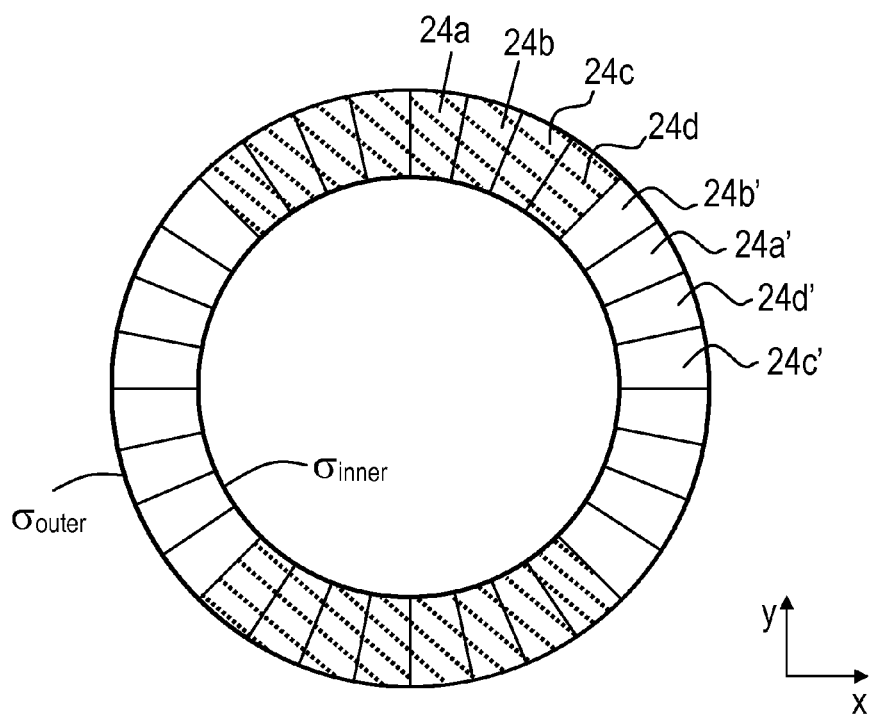
Figure 6A:
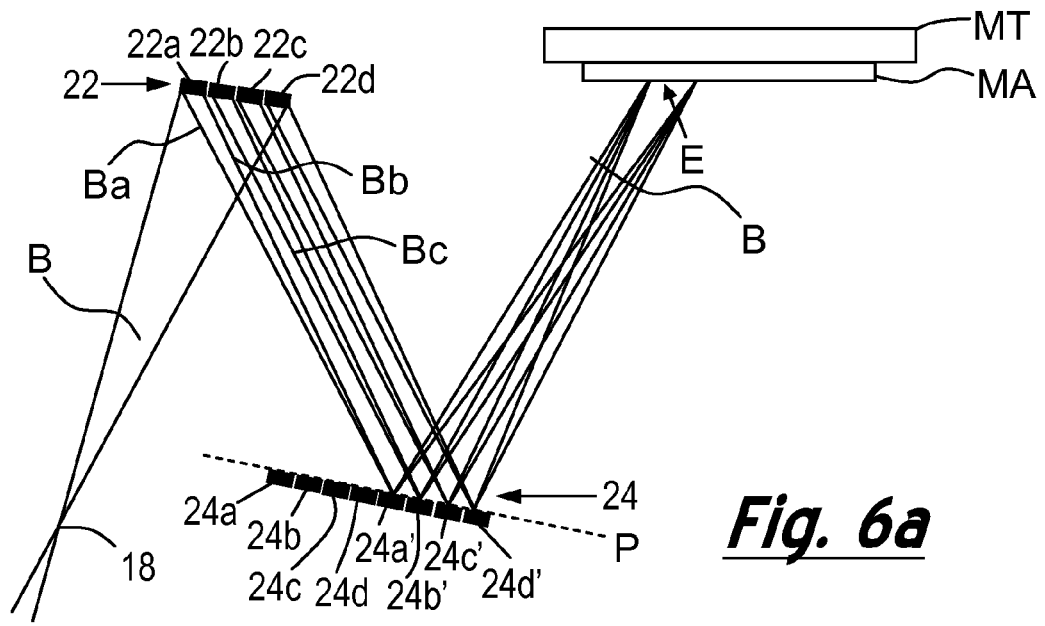
FIGS. 6a and 6b illustrate operation of moveable reflective elements of an illumination system of the lithographic apparatus, and a resulting x-dipole illumination mode.
Figure 6B:
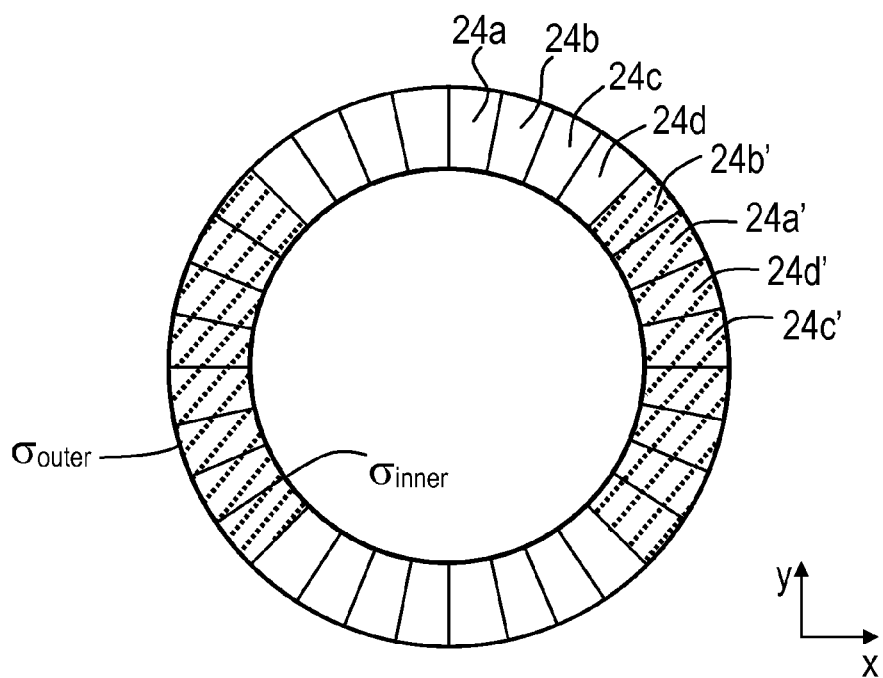

FIGS. 5 and 6 schematically illustrate the principle of redirecting radiation in order to change a spatial intensity distribution at the pupil plane P, and thereby obtain a desired illumination mode. The drawing planes of FIGS. 5b and 6b coincide with the pupil plane P shown in FIGS. 5a and 6a. Cartesian coordinates are indicated in FIGS. 5b and 6b in order to facilitate explanation of the Figures. The indicated Cartesian coordinates are not intended to imply any limitation on the orientation of the spatial intensity distributions that may be obtained. The radial extent of the spatial intensity distributions is defined by $\sigma_{inner}$ (inner radial extent) and $\sigma_{outer}$ (outer radial extent). The inner and outer radial extents may be circular, or may have some other shape.

As explained above, the spatial intensity distribution (and hence illumination mode) of the radiation beam pupil plane P is determined by the orientations of the primary reflective elements 22a-d. The illumination mode is controlled by selecting and then moving each of the primary reflective elements 22a-d to, for example, either its first orientation or its second orientation as required.

In this example there are 16 primary reflective elements, only 4 of which are shown (22a-d). When the primary reflective elements 22a-d are in their first orientations, sub-beams of radiation are reflected towards associated first locations 24a-d, as shown in FIG. 5a. Referring to FIG. 5b, the first locations 24a-d are at or close to the top of FIG. 5b. Other primary reflective elements (not illustrated) are also in their first orientations, and direct sub-beams of radiation to first locations which are at or close to the top of FIG. 5b, and at or close to the bottom of FIG. 5b. Locations which receive sub-beams of radiation are shaded using dotted lines. It can be seen from FIG. 5b that when the primary reflective elements 22a-d are in their first orientations, a dipole illumination mode is formed in which the poles are separated in the y-direction.

When the primary reflective elements 22a-d are in their second orientations, sub-beams of radiation are reflected towards associated second locations 24a'-d', as shown in FIG. 6a. Referring to FIG. 6b, the second locations 24a'-d' are at or close to the right hand side of FIG. 6b. Other primary reflective elements (not illustrated) are also in their second orientations, and direct sub-beams of radiation to second locations which are at or close to the right hand side of FIG. 6b, and at or close to the left hand side of FIG. 6b. Locations which receive sub-beams of radiation are shaded using dotted lines. It can be seen from FIG. 6b that when the primary reflective elements 22a-d are in their second orientations, a dipole illumination mode is formed in which the poles are separated in the x-direction.

Switching from the y-direction dipole illumination mode to the x-direction dipole illumination mode is achieved by moving each of the primary reflective elements 22a-d from the first orientation to the second orientation. Similarly, switching from the x-direction dipole illumination mode to the y-direction dipole illumination mode is achieved by moving each of the primary reflective elements 22a-d from the second orientation to the first orientation.

Other modes may be formed by moving some of the primary reflective elements 22a-d to their first orientation and some to their second orientation, as is explained further below. The first orientation and second orientation of each primary reflective element (and consequently the first and second associated locations) may be chosen so as to maximize the number of useful illumination modes that can be produced.

The primary reflective elements may be moved between first orientations and second orientations by rotating them about certain axes. The primary reflective elements may be moved using one or more actuators.

One or more primary reflective elements may be configured to be driven to rotate around the same axis. One or more other primary reflective elements may be configured to be driven to rotate around other axes.

In an embodiment, a primary reflective element comprises an actuator arranged to move the primary reflective element between the first orientation and the second orientation. The actuator may be, for example, a motor. The first and second orientations may be defined by end stops. A first end stop may comprise a mechanical apparatus which prevents the primary reflective element from moving beyond the first orientation. A second end stop may comprise a mechanical apparatus which prevents the primary reflective element from moving beyond the second orientation. A suitable mount for the primary reflective element, which includes end stops, is described further below in relation to FIGS. 11 to 15.

Since movement of the primary reflective element may be limited by end stops, the primary reflective element can be accurately moved to the first orientation or the second orientation without needing to monitor the position of the primary reflective element (e.g. without needing to use a position monitoring sensor and a feedback system). The primary reflective elements may be oriented sufficiently accurately that they may form illumination modes of sufficient quality to be used in lithographic projection of a pattern from a patterning device onto a substrate.

A driver signal supplied to the actuator may be a binary signal. There may be no need to use a more complex signal such as a variable analog voltage or a variable digital voltage, since the actuator may only need to move the primary reflective element to a first end stop or to a second end stop. The use of a binary (two-valued) driver signal for the actuator, rather than a more complex system, allows a more simple control system to be used than would otherwise be the case.

The apparatus described above in relation to FIGS. 5 and 6 includes 16 primary reflective elements. In practice, many more primary reflective elements may be provided. However, 16 primary reflective elements is a sufficient number to allow illustration of the way in which several different illumination modes may be obtained. The following illumination modes may be obtained using 16 primary reflective elements: annular, c-quad, quasar, dipole-y and dipole-x. These illumination modes are formed by configuring the 16 primary reflective elements so as to appropriately direct radiation towards 32 associated locations at the pupil plane of the illumination system.

Figure 7:
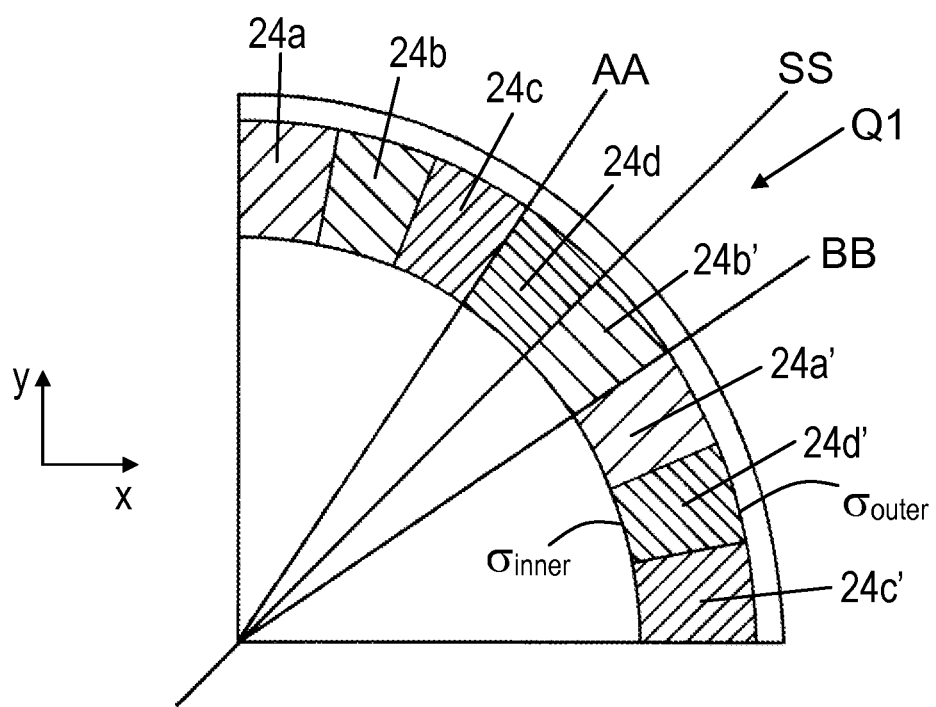
FIG. 7 depicts a first quadrant of a pupil plane.

FIG. 7 depicts a first quadrant of a pupil plane Q1 in an illumination system that is configured to produce the five different desired illumination modes. Each segment 24a-d, 24a'-d' of the quadrant corresponds to an illumination location (i.e. a location which receives a radiation sub-beam from a primary reflective element). In an embodiment, the illumination locations are arranged circumferentially around the pupil plane in an annular shape. An inner radial extent of the illumination locations is labeled as $\sigma_{inner}$. An outer radial extent of the illumination locations is labeled as $\sigma_{outer}$.

A plurality of secondary reflective elements may be provided at each illumination location. For example between 10 and 20 secondary reflective elements may be provided at each illumination location. Where this is the case, the number of primary reflective elements scales accordingly. For example, if there are 10 secondary reflective elements at a given illumination location, then there are 10 primary reflective elements arranged to direct radiation to that illumination location (each of the primary reflective elements being arranged to direct radiation to a different secondary reflective element). In the following description, where the term 'primary reflective element' is used, this may encompass a plurality of primary reflective elements which are configured to move in unison.

The relative surface area of illumination locations across the pupil plane amounts to $(\sigma_{outer}^2 - \sigma_{inner}^2)/2$. Thus, the etendue ratio X (i.e. the inverse of the relatively used pupil area) follows as $X=2/(\sigma_{outer}^2 - \sigma_{inner}^2)$.

In the quadrant Q1 depicted in FIG. 7, there are 8 illumination locations 24a-d, 24a'-d' (corresponding with 32 illumination locations across the entire pupil plane). Each illumination location is sized and shaped to be illuminated by a sub-beam of radiation reflected by a primary reflective element. Each primary reflective element is configured so as to separately illuminate two illumination locations from different parts of the same quadrant. More specifically, each primary reflective element is configured to move between a first orientation and a second orientation so as to direct radiation and thereby illuminate either a first associated illumination location or a second associated illumination location in the same quadrant.

Although pairs of illumination locations 24a,a' (and others) are provided in the same quadrant Q1 in FIG. 7, it is not necessary that this is the case. For example, a first illumination location may be provided in one quadrant, and its pair may be provided in a different quadrant. If the separation between the first and second illumination locations of a pair of illumination locations is increased, then the amount of rotation required by the primary reflective element in order to direct a radiation sub-beam to those illumination locations will also increase. The positions of the illumination locations may be selected such that the required rotation of the primary reflective elements is minimized, or that none of the primary reflective elements is required to rotate by more than a certain maximum rotation. The positions of the illumination locations may be such that a desired set of illumination modes may be obtained (for example as explained further below in relation to FIG. 8).

A first primary reflective element 22a (see FIGS. 5 and 6) is configured to illuminate a first associated illumination location 24a of the quadrant Q1 when orientated in a first orientation, and a second associated illumination location 24a' of the quadrant when orientated in a second orientation. A second primary reflective element 22b is configured to illuminate a first associated illumination location 24b when orientated in a first orientation and a second associated illumination location 24b' when orientated in a second orientation. A third primary reflective element 22c is configured to illuminate a first associated illumination location 24c when orientated in a first orientation and a second associated illumination location 24c' when orientated in a second orientation. A fourth primary reflective element 22d is configured to illuminate a first associated illumination location 24d when orientated in a first orientation and a second associated illumination location 24d' when orientated in a second orientation.

An equivalent arrangement of the illumination locations and associated primary reflective regions may apply for other quadrants (not illustrated).

Each primary reflective element is moved between the first orientation and second orientation by rotating it about a certain axis. A plurality of primary reflective elements may be configured so as to rotate about the same axis. For example, primary reflective elements associated with adjacent illumination locations in the same quadrant of the pupil plane may be configured so as to rotate about the same axis. In the illustrated example, the first and second primary reflective elements 22a, 22b are configured to rotate about a first axis AA, and the third and fourth primary reflective elements 22c, 22d are configured to rotate about second axis BB. The first axis AA is arranged at 56.25° with respect to the x-axis in Q1, and the second axis BB is arranged at 33.75° with respect to the x-axis in Q1. Although the first and second axes AA, BB are shown in the plane of FIG. 7, this is for ease of illustration only. The axes will be in the plane of the primary reflective elements 22a-d.

Additionally or alternatively, primary reflective elements associated with corresponding illumination locations in opposing quadrants of the pupil plane may be configured to rotate about the same axis. For example, primary reflective elements 22a,b associated with the first quadrant Q1 and corresponding primary reflective elements associated with a third quadrant may be configured to rotate about the first axis AA. Likewise, primary reflective elements 22c,d associated with the first quadrant Q1 and corresponding primary reflective elements associated with the third quadrant may be configured to rotate about the second axis BB.

Primary reflective elements associated with a second quadrant, and primary reflective elements associated with a fourth quadrant, may be rotated about a third axis (e.g. arranged at 123.75° with respect to the x axis). In addition, primary reflective elements associated with the second quadrant and primary reflective elements associated with the fourth quadrant may be rotated about a fourth axis (e.g. arranged at 146.25° with respect to the x axis). Neither of these quadrants are shown in FIG. 7.

The primary reflective elements may be configured to rotate in the same direction or opposite directions about same axis.

When primary reflective elements are grouped together to rotate about the same axis, and to rotate in the same direction, an actuator arranged to move the primary reflective elements between their first and second orientations may be simplified. For example, an actuator associated with primary reflective elements that are grouped to rotate about the same axis may be arranged to move those primary reflective elements in unison. Thus, in an embodiment in which there are four axes of rotation, there may be four actuators.

FIG. 8 shows how five different illumination modes may be formed at the pupil plane of the illumination system, using the described apparatus (i.e. using 16 primary reflective elements and 4 axes of rotation). The illumination modes are as follows: annular illumination mode (FIG. 8a), dipole-x illumination mode (FIG. 8b), dipole-y illumination mode (FIG. 8c), quasar illumination mode (FIG. 8d) and c-quad illumination mode (FIG. 8e).

To produce the annular illumination mode, as shown in FIG. 8a, the primary reflective elements 22a-d associated with the first quadrant are oriented such that illumination locations 24b, 24d, 24a' and 24c' are illuminated. This is achieved by rotating the first primary reflective element 22a around the first axis AA to its second orientation, rotating the second primary reflective element 22b around the first axis AA to its first orientation, rotating the third primary reflective element 22c around the second axis BB to its second orientation, and rotating the fourth primary reflective element 22d around the second axis BB to its first orientation. The primary reflective elements associated with the illumination locations of the second, third and fourth quadrants are similarly orientated.

To produce a dipole-x illumination mode, as shown in FIG. 8b (see also FIG. 6b), the primary reflective elements associated with the first quadrant are orientated such that illumination locations 24b', 24a', 24d' and 24c' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its second orientation, and rotating the fourth primary reflective element 22d around the second axis BB to its second orientation. The primary reflective elements associated with the illumination locations of the second, third and fourth quadrants are similarly orientated.

To produce a dipole-y illumination mode, as shown in FIG. 8c (see also FIG. 5b), the primary reflective elements associated with the first quadrant are orientated such that illumination locations 24a, 24b, 24c and 24d are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its first orientation, and rotating the fourth primary reflective element 22d around the second axis BB to its first orientation. The primary reflective elements associated with the illumination locations of the second, third and fourth quadrants are similarly orientated.

To produce a quasar illumination mode, as shown in FIG. 8d, the primary reflective elements associated with the first quadrant are orientated such that illumination locations 24c, 24d, 24b' and 24a' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its first orientation, and rotating the fourth primary reflective element 22d around the second axis BB to its first orientation. The primary reflective elements associated with the illumination locations of the second, third and fourth quadrants are similarly orientated.

To produce a c-quad illumination mode, as shown in FIG. 8e, the primary reflective elements associated with the first quadrant are oriented such that illumination locations 24a, 24b, 24d' and 24c' are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its second orientation and rotating the fourth primary reflective element 22d around the second axis BB to its second orientation. The primary reflective elements associated with the illumination locations of the second, third and fourth quadrants are similarly orientated.

In the above description of the illumination modes shown in FIG. 8, it has been mentioned that the primary reflective elements associated with the illumination locations of the second, third and fourth quadrants are orientated similarly to the first quadrant. The following explains the manner in which this is done. It can be seen from FIG. 8 that the dipole, quasar and c-quad modes are symmetric about the x and y axes. The annular mode of FIG. 8a however is not symmetric about the x and y axes, although it is rotationally symmetric (for rotations of 90° or multiples thereof).

The fact that illumination modes do not share the same symmetry applies a constraint to the positions of the illumination locations. The constraint is that each pair of illumination locations has an associated pair of illumination locations, and the two pairs are symmetric about a line SS which bisects the quadrant (see FIG. 7). For example, the first pair of illumination locations 24a,a' is associated with the third pair of illumination locations 24c,c'. These two pairs are symmetric about the line SS. The second pair of illumination locations 24b,b' is associated with the fourth pair of illumination locations 24d,d'. These two pairs are also symmetric about the line SS. The same constraint is applied to the other quadrants.

The second quadrant is a mirror image of the first quadrant. The third and fourth quadrants are mirror images of the first and second quadrants. Positioning the illumination locations in this manner allows all of the illumination modes shown in FIG. 8 to be achieved. When any of the illumination modes shown in FIGS. 8b-d are to be produced, the orientations of corresponding primary reflective elements for each quadrant are the same. When the annular mode of FIG. 8a is to be produced, the orientations of the primary reflective elements for the first and third quadrants are opposite to those applied to the primary reflective elements for the second and fourth quadrants.

Figure 9:
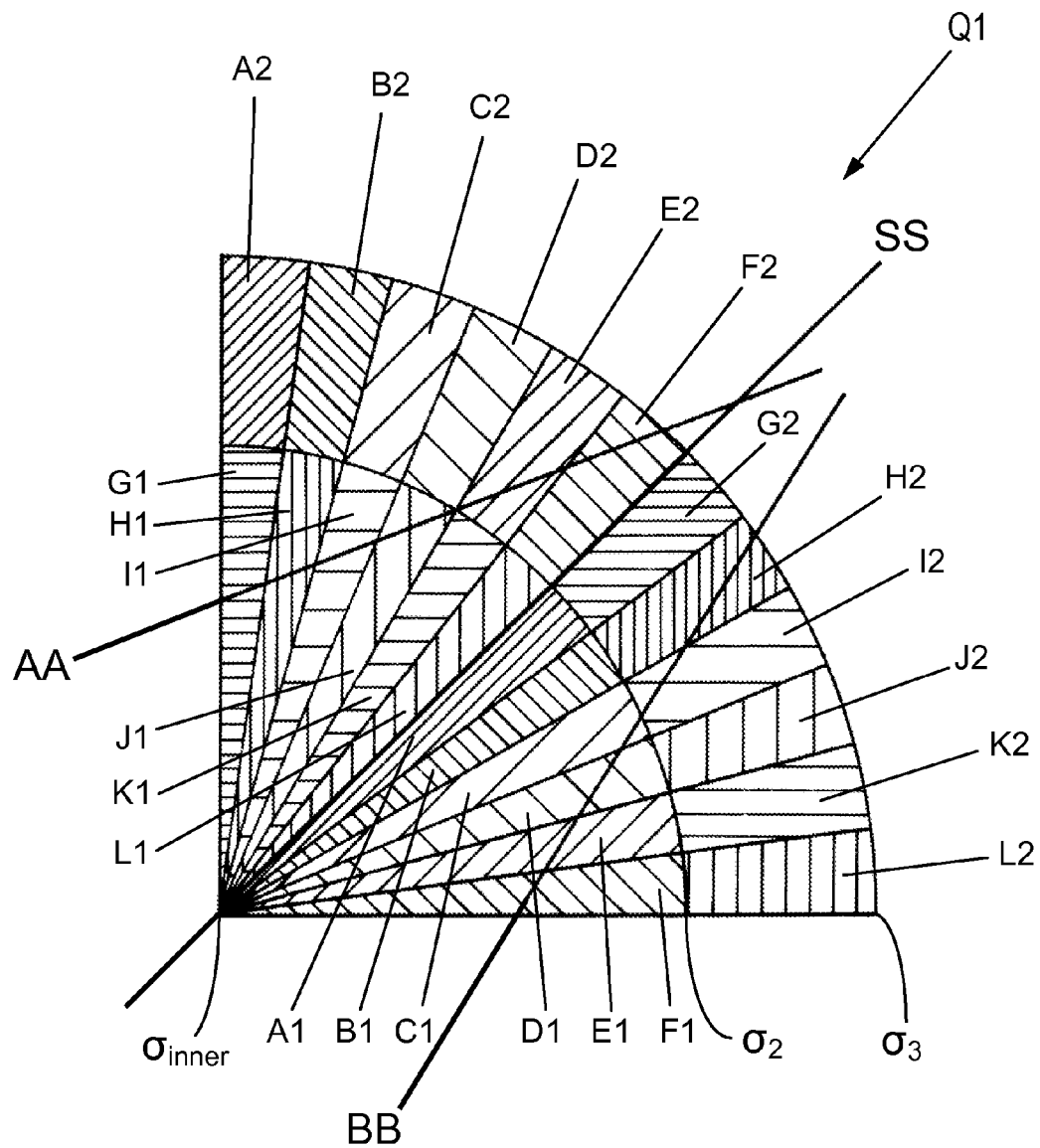
FIG. 9 depicts a first quadrant of a pupil plane.

In an embodiment, the illumination locations which are illuminated by radiation sub-beams may be provided, for example, as a disk and a ring, the ring lying adjacent to the disk (or may be provided as two rings). FIG. 9 depicts a first quadrant of a pupil plane Q1 with this arrangement of illumination locations. There are 24 illumination locations A1, A2 to L1, L2 in the quadrant Q1 (96 illumination locations across the entire pupil plane). 12 primary reflective elements A to L (not shown) are configured to illuminate the associated 24 illumination locations of the quadrant Q1 (48 primary reflective elements are configured to illuminate all of the illumination locations).

A plurality of secondary reflective elements may be provided at each illumination location. For example between 10 and 20 secondary reflective elements may be provided at each illumination location. Where this is the case, the number of primary reflective elements scales accordingly. For example, if there are 10 secondary reflective elements at a given illumination location, then there are 10 primary reflective elements arranged to direct radiation to that illumination location (each of the primary reflective elements being arranged to direct radiation to a different secondary reflective element). In this description, where the term 'primary reflective element' is used, this may encompass a plurality of primary reflective elements which are configured to move in unison.

The illumination locations may be classified as an inner illumination location group and an outer illumination location group. The illumination locations in the inner illumination location group are illuminated when associated primary reflective elements are in their first orientations. The illumination locations in the outer illumination location group are illuminated when associated primary reflective elements are arranged in their second orientations.

The inner illumination location group has an inner radial extent $\sigma_{inner}$ and an outer radial extent $\sigma_2$. The outer illumination location group has an inner radial extent $\sigma_2$ and an outer radial extent $\sigma_3$.

The relative surface area of the illumination locations across the pupil plane amounts to $(\sigma_3^2 - \sigma_{inner}^2)/2$. Thus, the etendue ratio X (i.e. the inverse of the relatively used pupil area) follows as $X = 2/(\sigma_3^2 - \sigma_{inner}^2)$.

Each primary reflective element is configured so as to separately illuminate two illumination locations from different parts of the same quadrant (e.g. Q1). More specifically, each primary reflective element is configured to move between a first orientation and a second orientation. When the primary reflective element is in the first orientation, a radiation sub-beam is directed towards a first associated illumination location in the inner illumination location group. When the primary reflective element is in the second orientation, the radiation sub-beam is directed towards a second associated illumination location in the outer illumination location group (both locations being in the same quadrant).

Referring to FIG. 3 and FIG. 9, a primary reflective element 22a may be configured to illuminate a first associated illumination location A1 when in its first orientation, and to illuminate a second associated illumination location A2 when in its second orientation. A different primary reflective element 22b may be configured to illuminate a first associated illumination location B1 when in its first orientation, and a second associated illumination location B2 when in its second orientation. Other primary reflective elements may be configured in the same way.

A constraint is applied to the positions of the illumination locations. The constraint is that each pair of illumination locations has an associated pair of illumination locations, and the two pairs are symmetric about a line SS which bisects the quadrant. For example, the first pair of illumination locations A1, A2 is associated with a seventh pair of illumination locations G1, G2. These two pairs are symmetric about the line SS. In a second example, the second pair of illumination locations B1, B2 is associated with the fourth pair of illumination locations H1, H2. These two pairs are also symmetric about the line SS. The same constraint is applied to the other pairs of illumination locations. Furthermore, the same constraint is applied to the other quadrants.

The configuration of the illumination locations and associated primary reflective elements may be the same for each of the quadrants of the pupil plane. For example, the second quadrant may be a mirror image of the first quadrant. The third and fourth quadrants may be mirror images of the first and second quadrants.

Each of the primary reflective elements may be moved between a first orientation and a second orientation by rotating it about a certain axis. Rotation may be limited by one or more end-stops. In order to radiate an illumination location in the outer illumination group and an illumination location in the inner illumination group, it may be the case that the axis does not pass through the optical axis of the illumination system.

Referring to FIG. 3 and FIG. 9, a first primary reflective element 22a which illuminates first associated illumination locations A1, A2 may rotate about a first axis AA. A second primary reflective element 22b which illuminates second associated illumination locations L1, L2 may rotate about a second axis BB. Other primary reflective elements may rotate about other axes (not illustrated). In total there are 12 axes of rotation for the first quadrant Q1. Rotation axes for the third quadrant are parallel to those for the first quadrant. There are 12 rotation axes for the second quadrant, and these are parallel to the rotation axes for the fourth quadrant. In total therefore there are 24 rotation axes.

Primary reflective elements associated with corresponding illumination locations in opposing quadrants of the pupil plane may be configured to rotate about the same axis. In the example depicted in FIG. 9, there may for example be 12 axes of rotation in total. This comprises 6 axes extending across Q1 and Q3, and 6 axes extending across Q2 and Q4.

The primary reflective elements may be used to produce seven different illumination modes. The illumination modes are shown in FIG. 10. The illumination modes are: a conventional (disk) mode, an annular mode, a second disk mode, dipole modes and quadrupole modes.

Figure 10A:
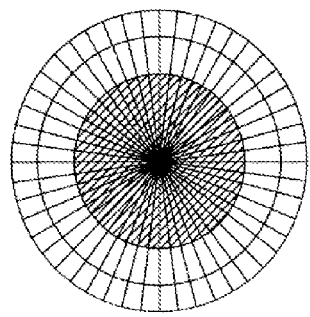
FIGS. 10a-g depict seven illumination modes obtainable using an embodiment of the invention.

To produce the conventional (disk) mode, shown in FIG. 10a, the primary reflective elements associated with the quadrant Q1 are orientated such that illumination locations A1 to L1 are illuminated. This is achieved by rotating every primary reflective element about its axis to its first orientation. The primary reflective elements associated with the illumination locations of the second, third and fourth quadrants are similarly orientated. If the inner radial extent $\sigma_{inner}$ were not zero, but was instead a finite value, then this mode would be an annular mode rather than the conventional (disk) mode.

Figure 10B:
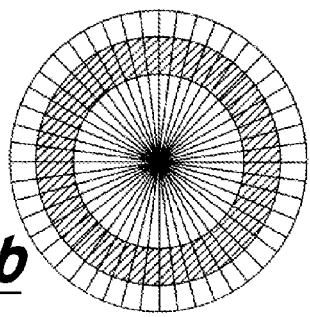

To produce the annular illumination mode, shown in FIG. 10b, the primary reflective elements associated with the quadrant Q1 are orientated such that illumination locations A2 to L2 are illuminated. This is achieved by rotating every primary reflective element about its axis to its second orientation. The primary reflective elements associated with the illumination locations of the second, third and fourth quadrants are similarly orientated.

Figure 10C:
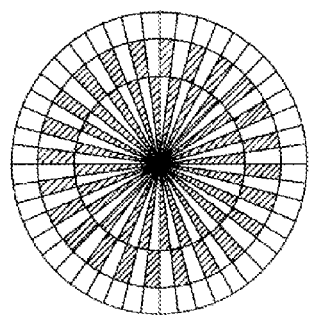

To produce the second disk illumination mode, as shown in FIG. 10c, the primary reflective elements associated with quadrant Q1 are orientated such that illumination locations A2, B1, C2, D1, E2, F1, G2, H1, I2, J1, K2 and L1 are illuminated. This is achieved by rotating those primary reflective elements associated with illumination locations A, C, E, G, I and K about their axes to their second orientations, and rotating primary reflective elements associated with illumination locations B, D, F, H, J and L about their axes to their first orientations. The primary reflective elements associated with the illumination locations of the second, third and fourth quadrants are similarly orientated.

Figure 10D:
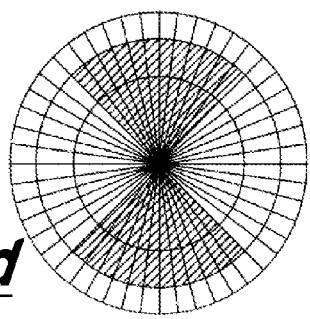

To produce a y-dipole mode illumination mode, as shown in FIG. 10d, the primary reflective elements associated with quadrant Q1 are orientated such that illumination locations A2 to F2 and G1 to L1 are illuminated. This is achieved by rotating primary reflective elements associated with illumination locations A to F around their axes to their second orientations, and rotating primary reflective elements associated with illumination locations G to L around their axes to their first orientations. The primary reflective elements associated with the illumination locations of the second, third and fourth quadrants are similarly orientated.

Figure 10E:
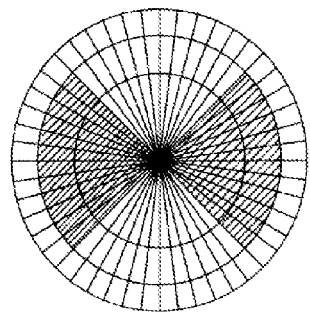

To produce a x-dipole illumination mode, as shown in FIG. 10e, the primary reflective elements associated with quadrant Q1 are orientated such that illumination locations A1 to F1 and G2 to L2 are illuminated. This is achieved by rotating primary reflective elements associated with illumination locations A to F around their axes to their first orientations, and rotating primary reflective elements associated with illumination locations G to L around their axes to their second orientations. The primary reflective elements associated with the illumination locations of the second, third and fourth quadrants are similarly orientated.

Figure 10F:
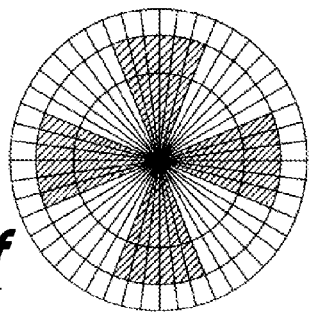

To produce a quadrupole illumination mode, as shown in FIG. 10f, the primary reflective elements associated with quadrant Q1 are orientated such that illumination locations D1 to I1, J2 to L2 and A2 to C2 are illuminated. This is achieved by rotating primary reflective elements associated with illumination locations D to I around their axes to their first orientations, and rotating primary reflective elements associated with illumination locations J to L and A to C about their axes to their second orientations. The primary reflective elements associated with the illumination locations of the second, third and fourth quadrants are similarly orientated.

Figure 10G:
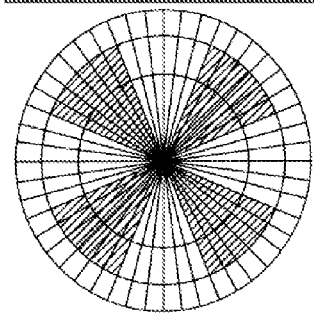

To produce an alternative quadrupole illumination mode, as shown in FIG. 10g, the primary reflective elements associated with the quadrant Q1 are orientated such that illumination locations A1 to C1, G2 to I2, J1 to L1 and D2 to F2 are illuminated. This is achieved by rotating primary reflective elements associated with illumination locations A to C and J to L around their axes to their first orientations, and rotating primary reflective elements associated with illumination locations G to I and D to F around their axes to their second orientations. The primary reflective elements associated with the illumination locations of the second, third and fourth quadrants are similarly orientated.

The primary reflective elements may also be oriented to produce other desired illumination modes at the pupil plane.

Figure 11:
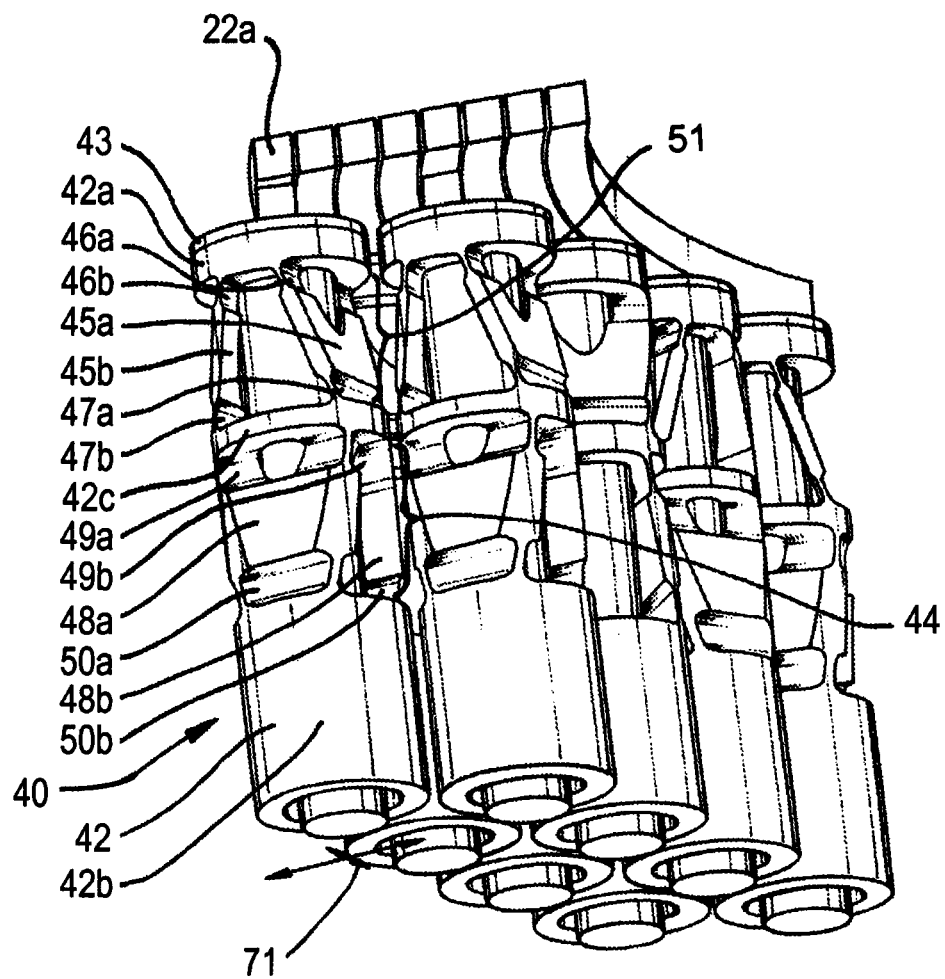
FIG. 11 depicts a plurality of mountings and reflective elements according to an embodiment of the invention.

FIG. 11 is a perspective view of eight mountings, each of which holds a different primary reflective element (referred to hereafter as a mirror). In order to aid clarity, only the first mirror 22a and first mounting 40 are labeled.

Figure 12:
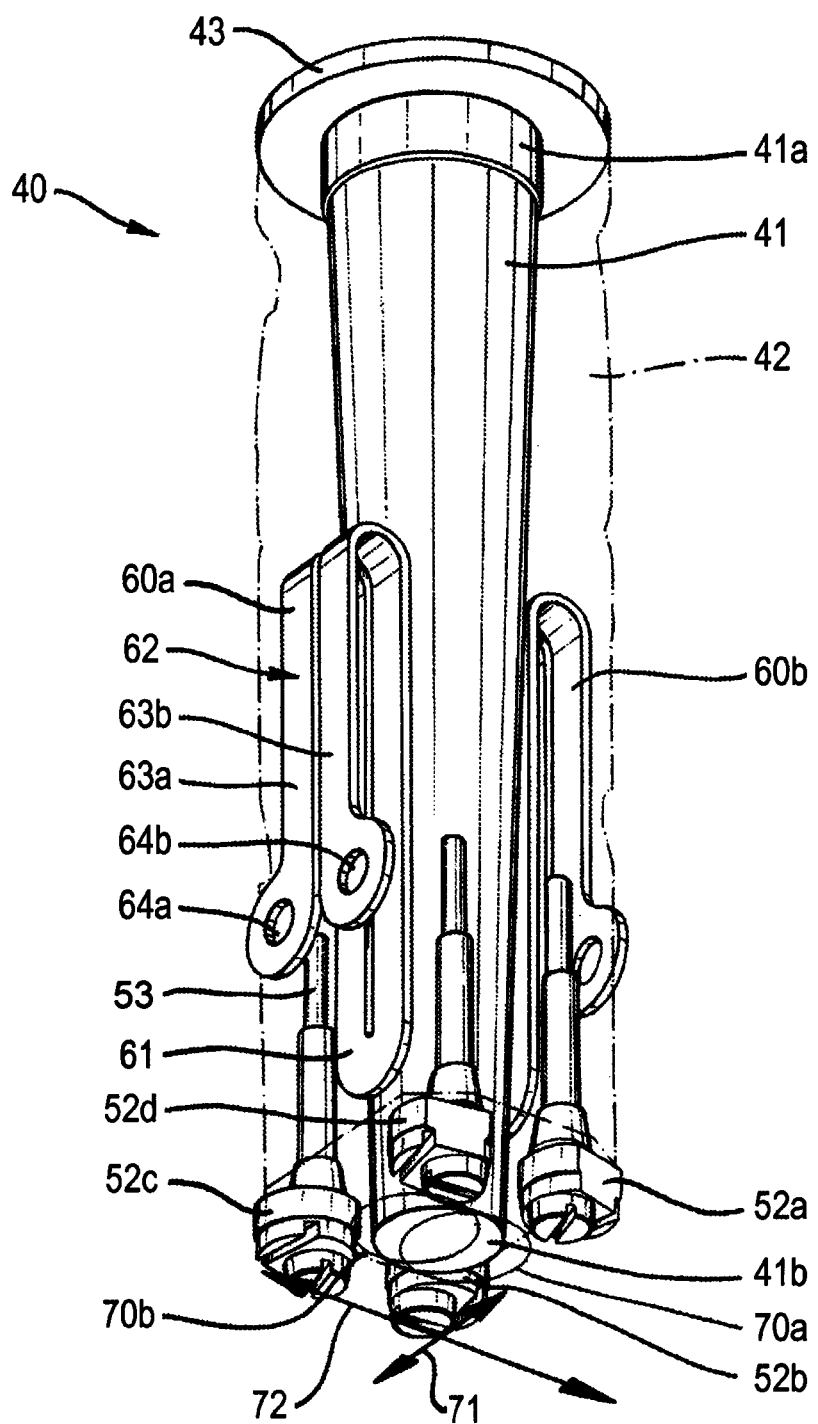
FIG. 12 depicts in more detail one of the mountings of FIG. 11.

One of the mountings 40 is shown in enlarged form in FIG. 12. Parts of the mounting are semi-transparent, in order to allow the construction of the mounting to be seen. The mounting 40 comprises a rod 41 which is contained in a sleeve 42. The rod 41 is, in an embodiment, cylindrical in cross-section, and tapers from an uppermost end 41a to a lowermost end 41b. A (circular) platform 43 is provided at the uppermost end 41a of the rod 41.

The sleeve 42 may be more clearly seen in FIG. 11, since this Figure is not semi-transparent. The sleeve 42 has an (annular) uppermost end 42a and a (annular) lowermost end 42b. Two resiliently flexible portions 51, 44 are provided between the uppermost end 42a and the lowermost end 42b of the sleeve 42. The resiliently flexible portions 51, 44 are separated by a middle (annular) portion 42c of the sleeve. The resiliently flexible portions 51, 44 will be referred to hereafter as the first resiliently flexible portion 51 and the second resiliently flexible portion 44.

The first resiliently flexible portion 51 comprises two rigid middle sections 45a, 45b which are connected between the uppermost end 42a of the sleeve and the middle portion 42c of the sleeve. An upper end of each rigid middle section 45a,b is connected to the uppermost end 42a of the sleeve by a resilient connector 46a,b (referred to hereinafter as the uppermost resilient connectors 46a,b). A lower end of each rigid middle section is connected to the middle portion 42c of the sleeve by a resilient connector 47a,b (referred to hereinafter as the lowermost resilient connectors 47a,b). The rigid middle sections 45a,b are angled inwardly such that upper ends of the rigid middle sections are closer together than lower ends of the rigid middle sections.

The second resiliently flexible portion 44 has the same construction as the first resiliently flexible portion 51, but is rotated by 90 degrees around a central axis of the sleeve 42. Consequently, the first and second resiliently flexible portions 51, 44 are transverse to one another.

The second resiliently flexible portion 44 comprises two rigid middle sections 48a,b resiliently connected between the middle portion 42c of the sleeve and the lowermost end 42b of the sleeve. An upper end of each rigid middle section 48a,b is connected to the middle portion 42c by a resilient connector 49a,b (referred to hereinafter as the uppermost resilient connectors 49a,b). A lower end of each rigid middle section 48a,b is connected to the lowermost end 42b of the sleeve by a resilient connector 50a,b (referred to hereinafter as the lowermost resilient connectors 50a,b). The rigid middle sections 48a,b are angled inwardly such that upper ends of the rigid middle sections are closer together than lower ends of the rigid middle sections.

The use of the terms 'upper' and 'lower' in the description is intended merely to assist in the description of Figures, and is not intended to imply any limitation of the orientation of the mounting 40, the mirror 22a or other components. Referring to FIG. 3, it can be seen that the reflective surface of the mirror 22a may be facing downwards, in which case the mounting 40 may be substantially inverted.

The lowermost end 42b of the sleeve may be fixed to a substrate (not shown).

The sleeve 42 may be formed from a metal (or a metal alloy). The various features of the sleeve described above may be formed by starting with a cylinder and removing material from the cylinder in such a way that the features are formed. The material may for example be removed using wire erosion.

The resilient connectors 46, 47, 49, 50 comprise portions of the sleeve where the sleeve material is sufficiently thin that it may bend. The resilient connectors are linear. The linear connectors are provided in pairs (e.g. 46a,b) which run substantially parallel to one another. This configuration enables the resilient connectors to bend when the rod 41 is moved. The resilient connectors are sufficiently thick that they provide a degree of resilience, and thus return to their original orientation when no force is applied to the rod 41.

The resilient connectors of the second resiliently flexible portion 44 are thicker than the resilient connectors of the first resiliently flexible portion 51. Consequently, the second resiliently flexible portion 44 is less flexible than the first resiliently flexible portion 51.

The first resiliently flexible portion 51 may comprise more than two rigid middle sections and associated resilient connectors. For example, four or more rigid middle sections and associated resilient connectors may be provided. The same applies to the second resiliently flexible portion 44.

The cross-sectional dimension (e.g., diameter) of the rod 41 at the first resiliently flexible portion 51 is greater than the distance between the uppermost resilient connectors 46a,b. For this reason, part of the uppermost resilient connectors 46a,b is cut away in order to accommodate the rod 41. The cross-sectional dimension of the rod 41 is also greater than the distance between the rigid middle sections 45a,b. For this reason, part of the rigid middle sections 45a,b is cut away in order to accommodate the rod 41. The uppermost resilient connectors 49a,b of the second resiliently flexible portion 44 are partially cut away for the same reason.

Two bi-metallic strips 60a,b (see FIG. 12) are provided on opposite sides of the sleeve 42. Since the right hand bi-metallic strip is partially obscured in FIG. 12, the left hand bi-metallic strip will be described. The bi-metallic strip 60a comprises a flexing portion 61 which extends from a midpoint of the sleeve 42 down to a location adjacent to a lowermost end of the sleeve. The bi-metallic strip further comprises a connection portion 62 which is connected to the flexing portion 61 and extends downwardly from an intermediate location of the sleeve 42 along the outside of the sleeve. The connection portion 62 and the flexing portion 61 are formed as an elongated U-shape which has been bent over upon itself. Consequently, the connection portion 62 comprises a first arm 63a and a second arm 63b. Each arm 63a,b is provided with an opening 64a,b, each of which is arranged to receive a wire (not shown) or other electrical connector. The bi-metallic strip 60a is formed from two metals which are laminated together. The metals have different thermal coefficients of expansion such that heating of the bi-metallic strip will cause the bi-metallic strip to bend.

In use, current is passed through the first bi-metallic strip 60a thereby heating the bi-metallic strip. This causes the flexing portion 61 of the bi-metallic strip to bend inwardly (i.e. towards the rod 41). The flexing portion 61 pushes against the rod 41, causing the lowermost end 41b of the rod to move to a first position 70a (indicated by a circular line). The resilient connectors 46a,b, 47a,b of the first resiliently flexible portion 51 bend, thereby allowing the uppermost end 42a and the platform 43 to rotate. The platform 43 rotates about an axis parallel to an axis 71 indicated at the bottom of FIG. 12. Referring to FIG. 11, since a mirror 22a is connected to the platform 43, the mirror is also rotated around an axis parallel to the axis 71. Referring again to FIG. 12, the rod 41 moves until it presses against washers 52a,b. The washers 52a,b act as end stops which limit movement of the rod 41.

The operation of the first bi-metallic strip 60a described above rotates the mirror 22a to the first orientation (the first and second orientations of the mirror 22a are described further above). The second bi-metallic strip may be used to rotate the mirror 22a to the second orientation. The supply of current to the first bi-metallic strip 60a is stopped, thereby allowing the first bi-metallic strip to cool and return to its original orientation. Current is passed through the second bi-metallic strip 60b. The flexing portion of the second bi-metallic strip 60b pushes against the rod 41, causing the lowermost end 41b of the rod to move to a second position 70b (indicated by a circular line). The resilient connectors 46a,b, 47a,b of the first resiliently flexible portion 51 bend, thereby allowing the uppermost end 42a and the platform 43 to rotate. The platform 43 rotates about an axis parallel to the axis 71. The rod 41 moves until it presses against washers 52c,d. The washers 52c,d act as end stops which limit movement of the rod 41. Movement of the rod 41 to the second position rotates the mirror 22a to the second orientation.

The bi-metallic strips 60a,b provide a simple and robust actuator to actuate the mirror 22a between the first orientation and the second orientation, via movement of the rod 41. Other actuators may be used. The direction of movement of the rod 41 is indicated by a line 72.

The above description has referred to the resilient connectors 46a,b, 47a,b of the first resiliently flexible portion 51 bending, when the rod 41 moves. This occurs if the direction of movement 72 of the rod 41 is exactly transverse to the orientation of the resilient connectors 46a,b, 47a,b of the first resiliently flexible portion 51. However, the direction of movement of the rod 41 may differ from this. Where this is the case, the resilient connectors 49a,b, 50a,b of the second resiliently flexible portion 44 will also bend when the rod 41 moves. The extent to which the resilient connectors 49a,b, 50a,b of the second resiliently flexible portion 44 need to bend will be less than the extent to which the resilient connectors 46a,b, 47a,b of the first resiliently flexible portion 51 need to bend. For this reason, the resilient connectors 49a,b, 50a,b of the second resiliently flexible portion 44 are less flexible than the resilient connectors 46a,b, 47a,b of the first resiliently flexible portion 51.

Figure 13:
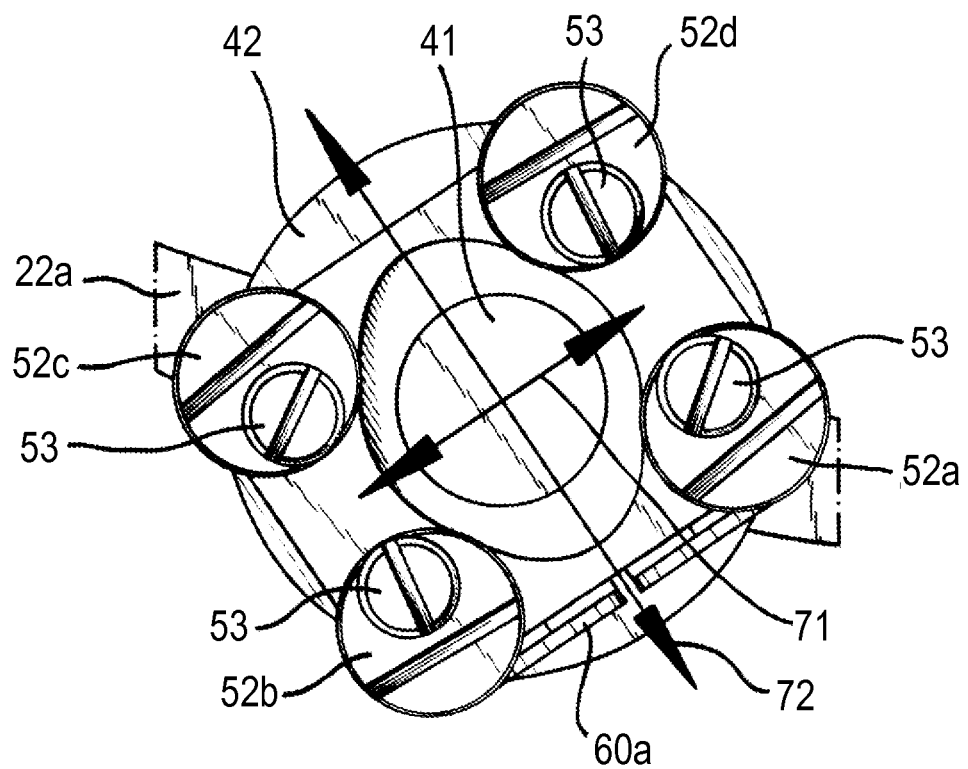
FIG. 13 depicts one of the mountings of FIG. 11 viewed from underneath.

As has been described further above in relation to FIG. 9, it may be desirable to rotate different mirrors about different axes. The mounting 40 allows rotation around different selected axes to be achieved, as will be described in relation to FIG. 13. FIG. 13 shows the mounting 40 viewed from below. The lowermost end of the rod 41 is visible, as is the lowermost end of the sleeve 42. The four washers 52a-d are held in place by bolts 53. One of the bi-metallic strips 60a may be seen (the other bi-metallic strip is not shown). The direction of movement of the rod 41 is indicated by line 72, and the corresponding axis of rotation of the mirror 22a is indicated by line 71.

On a coarse level, the direction of movement 72 of the rod 41 is determined by the orientation of the resilient connectors 46, 47 of the first resiliently flexible portion 51. This is because the resilient connectors 46, 47 of the first resiliently flexible portion 51 are more flexible than the resilient connectors 49, 50 of the second resiliently flexible portion 44, and the rod 41 tends to move accordingly. On a fine level, the direction of movement is determined by the positions of the washers 52a-d, since it is the washers which determine the end points of movement of the rod 41 (the washers act as end stops).

In order to obtain a desired direction of movement of the rod 41, and hence a desired axis of rotation of the mirror 22a, the mounting 40 is given an appropriate orientation before securing the mirror 22a to the mounting 40. The orientation of the mounting 40 is fixed by securing the mounting to a substrate (not shown) which holds the mounting. The orientation of the mounting determines the direction of movement of the rod 41 on a coarse level. Once mirror 22a has been secured to the mounting 40, fine adjustment of the direction of movement of the rod is achieved by changing the positions of one or more of the washers 52a-d.

Each washer 52a-d is secured to the mounting using a bolt 53 which passes through an aperture in the washer and into the sleeve 42. The aperture in each washer is not coaxial with the center of the washer, but is instead offset from the center. Since the aperture is offset, rotation of a washer 52a-d will cause an edge of the washer to move closer to or further away from the rod 41. Adjusting the orientation of a washer thus adjusts the location of the first position 70a or second position 70b of the rod 41. The washers 52a-d thereby provide fine adjustment of the direction of movement of the rod 41 (the direction of movement may be considered to be a straight line which connects the first rod position 70a and the second rod position 70b).

As can be seen from FIG. 11, the mounting 40 is wider than the mirror 22a. The mounting 40 may for example have a width which is more than 10 mm, and may have a width which is less than 20 mm. The mounting may have a width of 16 mm. In contrast, the mirrors may for example have a width which is less than 10 mm, and may for example have a width which is less than 5 mm. Providing a mounting 40 which is wider than the mirror 22a has an advantage that it gives greater robustness than would be the case if the mounting was the same width as the mirror. In addition, the mounting 40 may be able to conduct heat away from the mirror 22a more effectively. The mounting 40 may provide a greater degree of mechanical and thermal stability.

Figure 14:
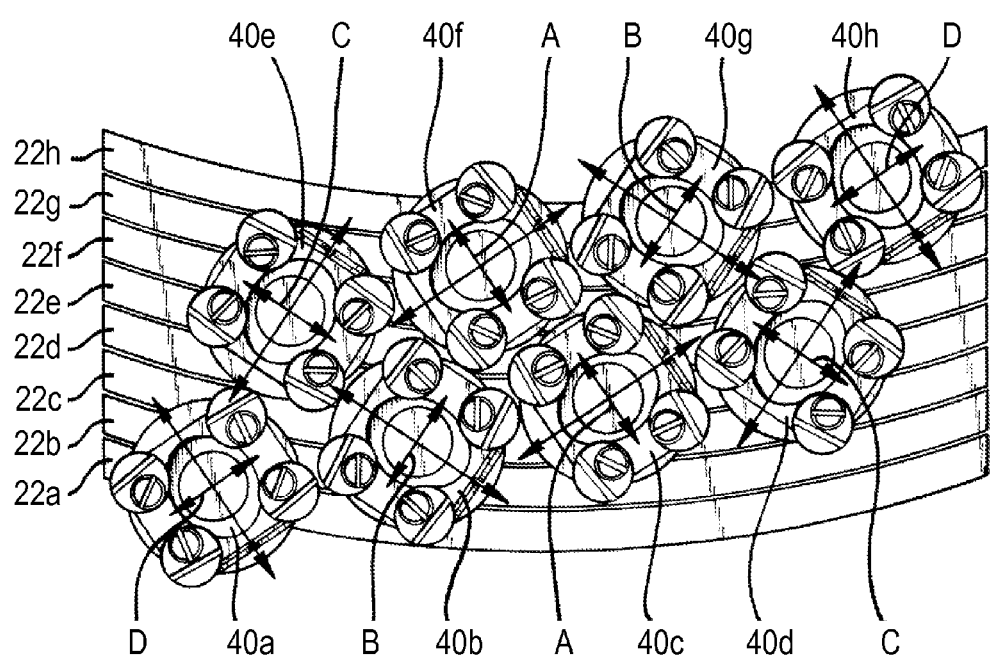
FIG. 14 depicts the mountings and reflective elements of FIG. 11 viewed from underneath.

In order to allow the mirrors to be located adjacent to one another, the mountings 40 are spread out beneath the mirrors. FIG. 14 shows eight mirrors 22a-h and eight associated mountings 40a-h viewed from below. It can be seen that each of the mountings 40*a-h* is connected to its associated mirror at a different position along the mirror 22*a-h*. The direction of movement of each rod 41 is indicated as a long arrow, and the axis of rotation of each mirror is shown by a short arrow.

Four axes of rotation A-D are shown in FIG. 14. Two of the axes of rotation A,B are closer to an axis which runs transverse to the mirrors (labeled here as the y-axis). Two of the axes of rotation C,D are closer to a perpendicular axis (labeled here as the x-axis). The use of Cartesian coordinates in FIGS. 14 and 15 is to assist in description of the Figures, and is not intended to restrict the orientation of the mirrors 22*a-h* or the mountings 40*a-h*.

Those mountings 40*b,c,g,f* which provide an axis of rotation A,B closer to the y-axis are located closer to the center of the mirrors 22*b,c,g,f*. Those mountings 40*a,d,e,h* which provide an axis of rotation C,D closer to the x-axis are located further away from the center of the mirrors 22*a,d,e,h*. Providing the mountings 40*a-h* at these locations has a beneficial effect with regard to shadowing arising from the mirrors.

Figure 15:
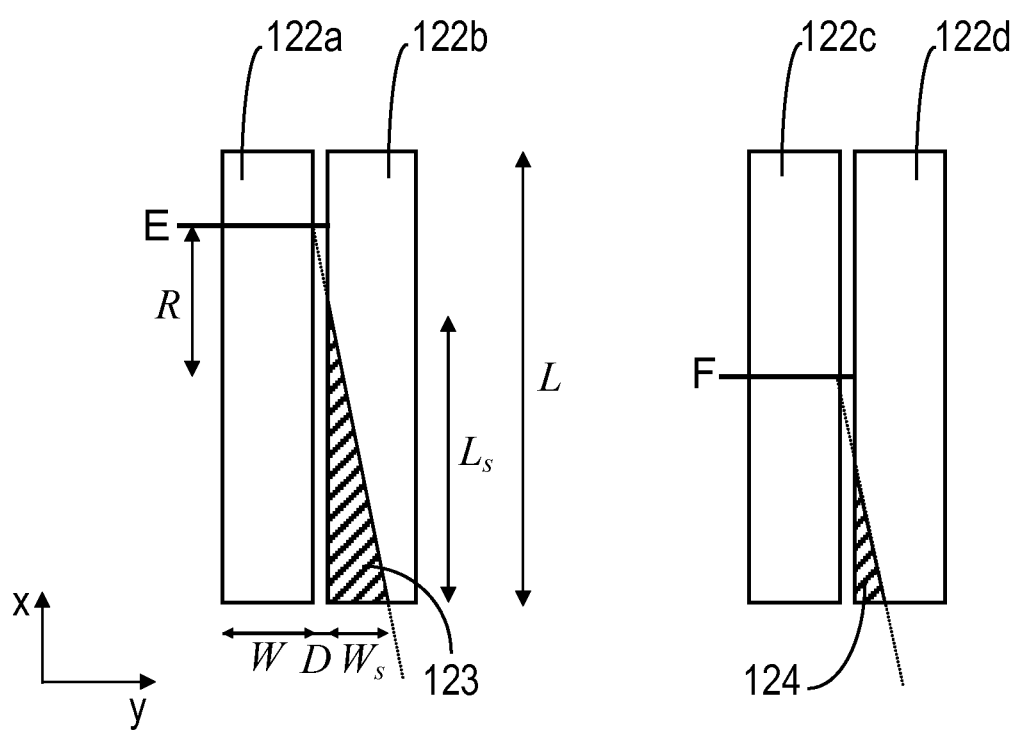
FIG. 15 depicts schematically shadowing of a reflective element by an adjacent reflective element.

FIG. 15 shows schematically two pairs of mirrors 122*a-d* viewed from above. For ease of illustration, and ease of geometric analysis, the mirrors are shown as rectangles rather than being curved. Referring first to the left hand side of FIG. 15, a left hand mirror 122*a* rotates about a rotation axis E which extends transverse to the mirror (labeled here as the y-direction) and is located towards one end of the mirror. The right hand mirror 122*b* is stationary. The mirror 122*a* may be rotated such that an upper part of the mirror moves into the plane of the Figure and a lower part of the mirror moves out of the plane of the Figure. Radiation may be incident upon the mirrors 122*a,b* from a direction which subtends an angle of 10 degrees to the left (negative y-direction) of a normal that extends from the plane of the Figure. In this situation, the left hand mirror 122*a* casts a shadow 123 onto the right hand mirror 122*b*. This is undesirable since the shadow will reduce the uniformity of an exposure area formed at a patterning device of the lithographic apparatus.

Referring to the right hand side of FIG. 15, a rotation axis F also extends transverse to the mirror 122*c*, but is located at the center of the mirror. Rotation of the mirror 122*c* gives rise to a significantly smaller shadow 124 on the right hand mirror 122*d*.

The mirrors shown in the left hand side of FIG. 15 are rectangular, and include various dimension labels. Geometry can be used to determine the width $W_s$ of the shadow:

$$W_s = \varphi\left(\frac{L}{2} + R\right)\tan(\theta) - D \quad (1)$$

where $\phi$ is the angle of rotation of the mirror, L is the length of the mirror, R is the distance between the rotation axis and the center of the mirror, $\theta$ is the angle of the incident radiation relative to the normal (the radiation coming from the negative y-direction), and D is the separation between the mirrors.

Geometry can be used to determine the length $L_s$ of the shadow:

$$L_s = \frac{W_s}{W_s + D} \cdot \left(\frac{L}{2} + R\right) \quad (2)$$

The area $A_s$ of the shadow can be determined by combining equations 1 and 2:

$$A_s = \frac{L_s \cdot W_s}{2} = \frac{W_s^2}{W_s + D} \cdot \left(\frac{L}{4} + \frac{R}{2}\right) \leq W_s \cdot \frac{L}{2} = \frac{L^2}{2}\varphi\tan\theta \quad (3)$$

The largest shaded area occurs for R=L/2 and D=0, which yields the expression at the right hand side of equation 3.

The shaded area 124 in the right hand side of FIG. 15, which occurs when R=0, follows directly from equation 3:

$$A_s = \frac{W_s^2}{W_s + D} \cdot \frac{L}{4} \leq W_s \cdot \frac{L}{4} = \frac{L^2}{8}\varphi\tan\theta \quad (4)$$

The above equations indicate that when a distance D between the mirrors is small, moving the axis of rotation from the center to the tip of the mirror increases the size of the shaded area by a factor of 4.

To minimize the extent to which shading of mirrors occurs, mirrors which rotate about an axis that is close to transverse to the mirrors are held on mountings which are located near the center of the mirrors. Mirrors which rotate about an axis that is less close to being transverse to the mirrors are held on mountings which are located further from the center of the mirrors. An example of this arrangement is shown in FIG. 14, as described further above.

Although described embodiments have referred to 16 primary reflective elements or 48 primary reflective elements, any suitable number of primary reflective elements may be used. Similarly, any suitable number of secondary reflective elements may be used. There are twice as many secondary reflective elements as primary reflective elements.

The above description has referred to a reflective illumination system (e.g. comprising part of an EUV lithographic apparatus). However, an embodiment of the invention may be provided in an illumination system which comprises refractive elements. An embodiment of the invention may be provided, for example, in a DUV lithographic apparatus. A refractive optical component may be provided in the illumination system pupil plane instead of or in addition to a reflective optical component.

Although the described embodiment of the invention refers to an illumination system of a lithographic apparatus, an embodiment of the invention may be provided at any suitable location in a lithographic apparatus.

Although the array of reflective elements is described in the context of a lithographic apparatus, it may be provided in other apparatus.

While specific embodiments of the invention have been described above, it will be appreciated that the invention may be practiced otherwise than as described. The description is not intended to limit the invention.

The features of the invention are applicable to all aspects of the invention and may be used in any combination.

The invention claimed is:

1. An array of reflective elements, at least one of the reflective elements being mounted on a mounting comprising
   a rod at least partially located within a sleeve, wherein a first end of the rod is fixed to a first end of the sleeve and a second end of the rod is moveable, the sleeve including a first resiliently flexible portion which is configured to bend in order to allow the movement of the second end of the rod to take place, wherein the reflective element is mounted at the first end of the sleeve such that bending of the sleeve causes rotation of the reflective element; and an actuator configured to directly push against the rod, to cause movement of the second end of the rod and rotation of the reflective element.

2. The array of claim 1, wherein the sleeve includes a second resiliently flexible portion which is also configured to bend in order to allow the movement of the rod to take place.

3. The array of claim 2, wherein the first resiliently flexible portion is configured to bend in a first direction, and the second resiliently flexible portion is configured to bend in a second direction, the first and second directions being substantially transverse to one another.

4. The array of claim 1, wherein the first resiliently flexible portion comprises at least two rigid portions which are connected at either end to other portions of the sleeve by resilient connectors.

5. The array of claim 4, wherein the first resiliently flexible portion comprises at least four rigid portions, including the at least two rigid portions, which are connected at either end to other portions of the sleeve by resilient connectors.

6. The array of claim 4, wherein at least one resilient connector comprises a linearly extending portion of the sleeve which is sufficiently thin to allow bending to take place.

7. The array of claim 4, wherein at least one of the rigid portions is oriented at an angle relative to a central axis of the sleeve.

8. The array of claim 1, wherein the sleeve is generally cylindrical.

9. The array of claim 1, wherein the mounting is provided with adjustable end stops which are configured to allow adjustment of a direction of movement of the rod.

10. The array of claim 9, wherein the end stops determine a first orientation and a second orientation of the reflective element by limiting the movement of the rod.

11. The array of claim 1, wherein the width of the mounting is greater than the width of the reflective element which is mounted on the mounting.

12. The array of claim 1, wherein a first reflective element is mounted on a first mounting and a second reflective element is mounted on a second mounting, the first mounting being arranged to allow rotation of the first reflective element about a first axis, and the second mounting being arranged to allow rotation of the second reflective element about a second axis, wherein the first axis is closer in orientation than the second axis to an axis running transverse to the reflective elements, and wherein the distance from the first mounting to a center of the first reflective element is greater than the distance from the second mounting to a center of the second reflective element.

13. A lithographic apparatus comprising:
an array of reflective elements, at least one of the reflective elements being mounted on a mounting comprising
a rod at least partially located within a sleeve, wherein a first end of the rod is fixed to a first end of the sleeve and a second end of the rod is moveable, the sleeve including a first resiliently flexible portion which is configured to bend in order to allow the movement of the second end of the rod to take place, wherein the reflective element is mounted at the first end of the sleeve such that bending of the sleeve causes rotation of the reflective element; and
an actuator configured to directly push against the rod, to cause movement of the second end of the rod and rotation of the reflective element.

14. The array of claim 1, wherein the actuator comprises a bi-metallic strip comprising a flexing portion configured to push against the rod when a current is passed through the bi-metallic strip.

15. The lithographic apparatus of claim 13, wherein the actuator comprises a bi-metallic strip comprising a flexing portion configured to push against the rod when a current is passed through the bi-metallic strip.

* * * * *